United States Patent
Goto

(10) Patent No.: US 6,839,376 B2
(45) Date of Patent: Jan. 4, 2005

(54) LASER LIGHT SOURCE

(75) Inventor: Chiaki Goto, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/000,123

(22) Filed: Dec. 4, 2001

(65) Prior Publication Data

US 2002/0071470 A1 Jun. 13, 2002

(30) Foreign Application Priority Data

Dec. 7, 2000 (JP) .................................... 2000-372286

(51) Int. Cl.⁷ .............................................. H01S 3/08
(52) U.S. Cl. ........................ 372/101; 372/92; 372/98
(58) Field of Search ........................... 372/92, 98, 101, 372/102

(56) References Cited

U.S. PATENT DOCUMENTS

| | | | | |
|---|---|---|---|---|
| 4,787,078 A | * | 11/1988 | Yokogawa | ................... 369/122 |
| 4,796,264 A | * | 1/1989 | Suzuki | ........................ 372/29 |
| 4,901,123 A | * | 2/1990 | Noguchi et al. | ............. 357/17 |
| 5,506,722 A | * | 4/1996 | Mizuuchi et al. | ........... 359/332 |
| 5,710,847 A | * | 1/1998 | Takano et al. | ................ 385/28 |
| 5,793,521 A | * | 8/1998 | O'Brien et al. | ............. 359/344 |
| 5,808,746 A | * | 9/1998 | Koishi et al. | ................ 356/445 |
| 5,870,417 A | * | 2/1999 | Verdiell et al. | ................ 372/32 |
| 5,995,692 A | * | 11/1999 | Hamakawa et al. | .......... 385/49 |
| 6,345,138 B1 | * | 2/2002 | Kawai et al. | ................. 385/49 |
| 2001/0050932 A1 | | 12/2001 | Sonoda et al. | |

FOREIGN PATENT DOCUMENTS

JP           10-254001          9/1998

OTHER PUBLICATIONS

Japanese Journal of Applied Physics Letters, 47 (3), pp. 183, Aug. 1985.

* cited by examiner

Primary Examiner—Don Wong
Assistant Examiner—Leith Al-Nazer
(74) Attorney, Agent, or Firm—Sughrue Mion, PLLC

(57) ABSTRACT

A laser light source is equipped with a semiconductor light-emitting device, a first wavelength selector, and a second wavelength selector. The first and second wavelength selectors are used to select the wavelength of the light emitted from the light-emitting device, and constitute an external resonator. The semiconductor light-emitting device is provided with a stripe, which is formed oblique to the cleaved end facets of the light-emitting device that do not constitute the external resonator. The end facets of the semiconductor light-emitting device are provided with coatings, which become antireflective coatings with respect to the selected wavelength.

29 Claims, 15 Drawing Sheets

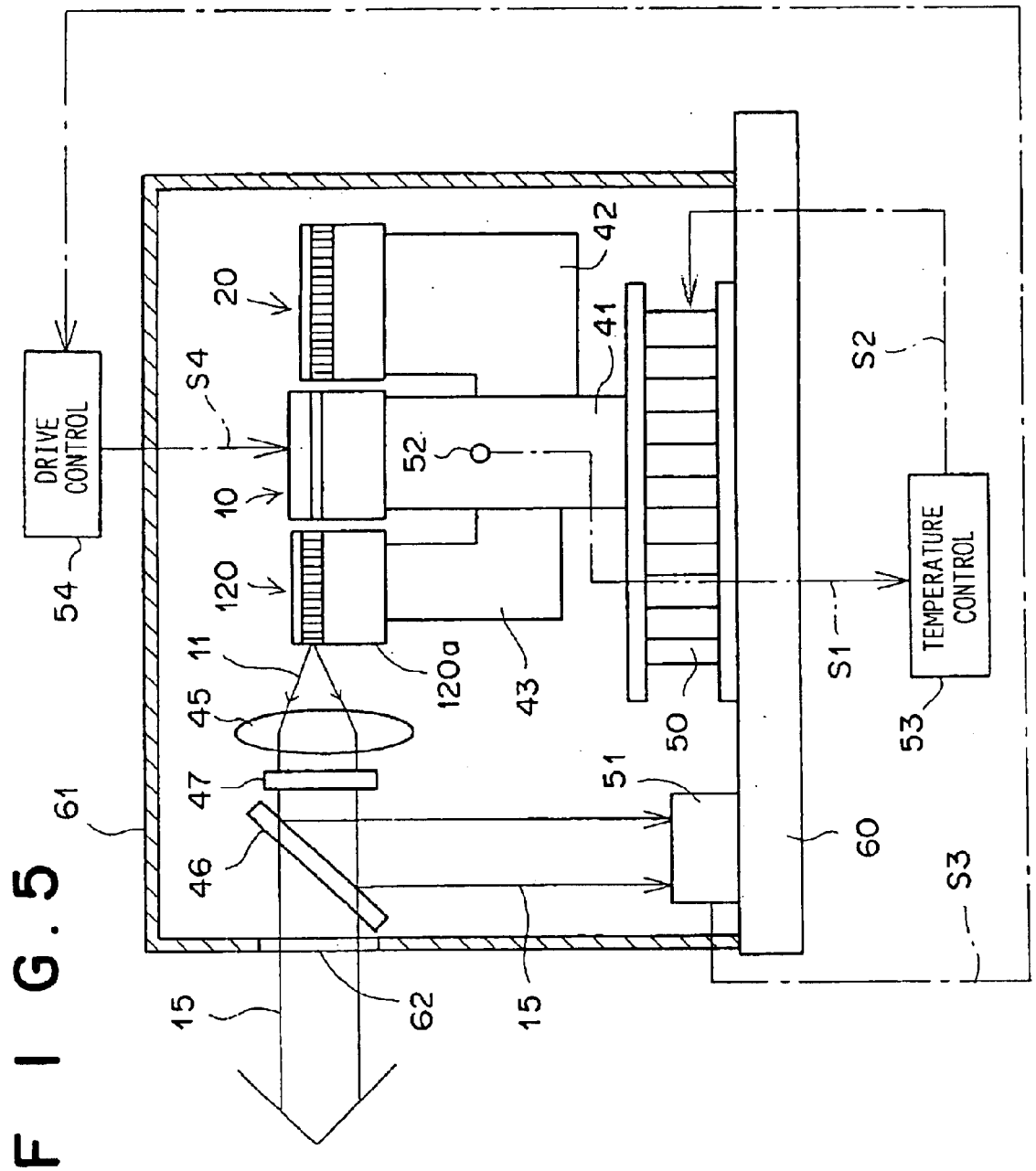
F I G. 5

F I G . 8
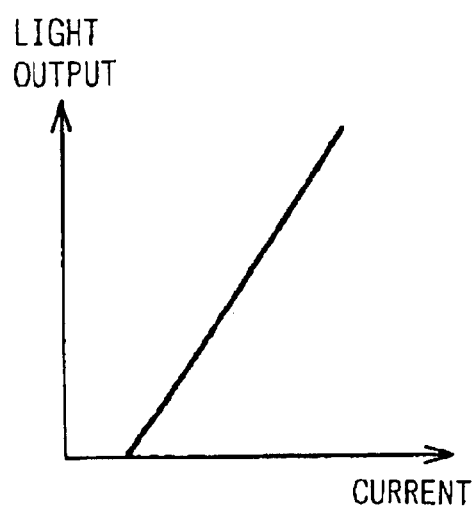
F I G . 9
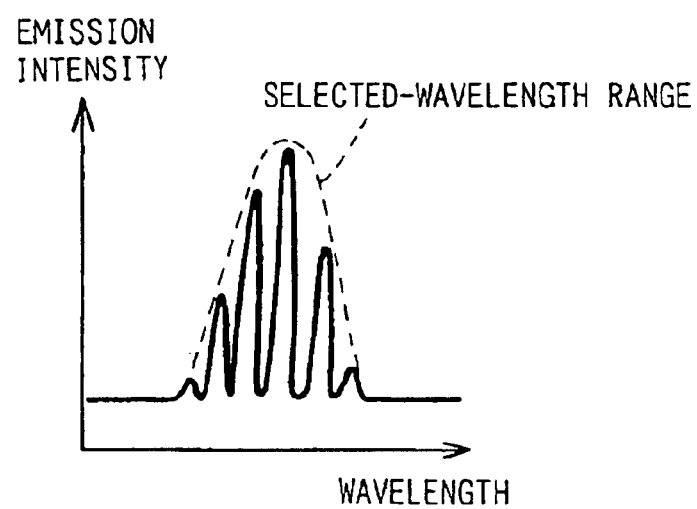

F I G . 11
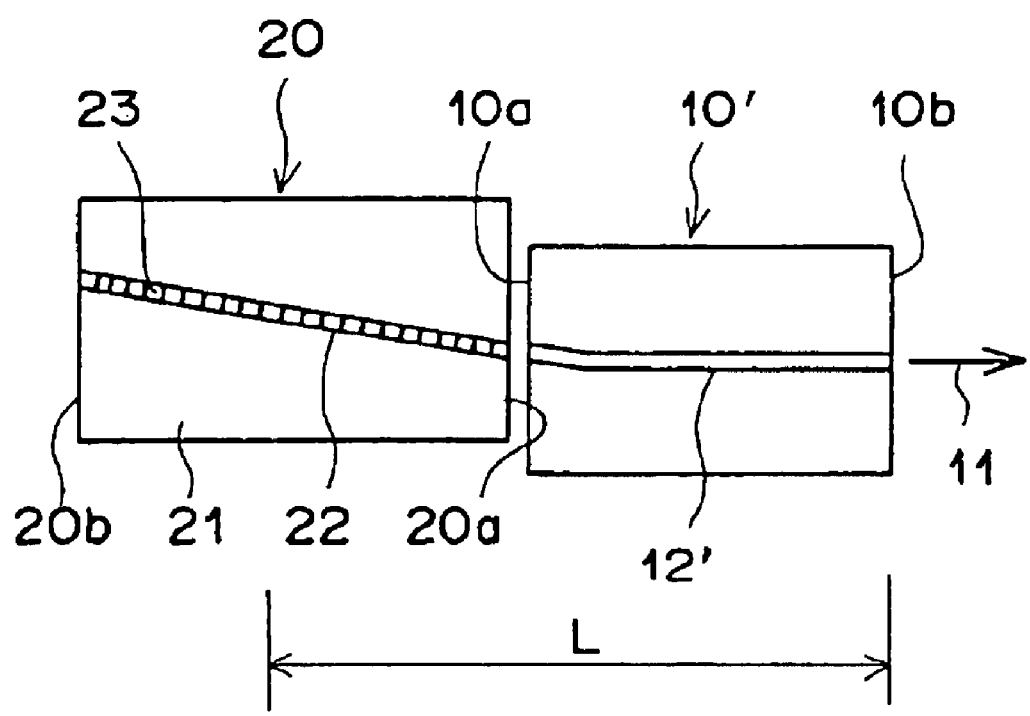

F I G . 12
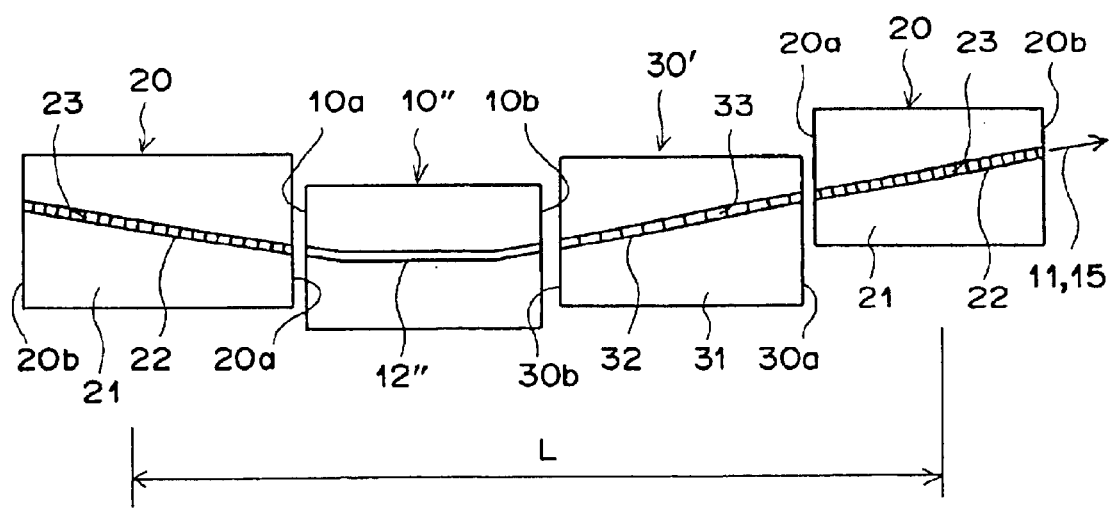

F I G . 14
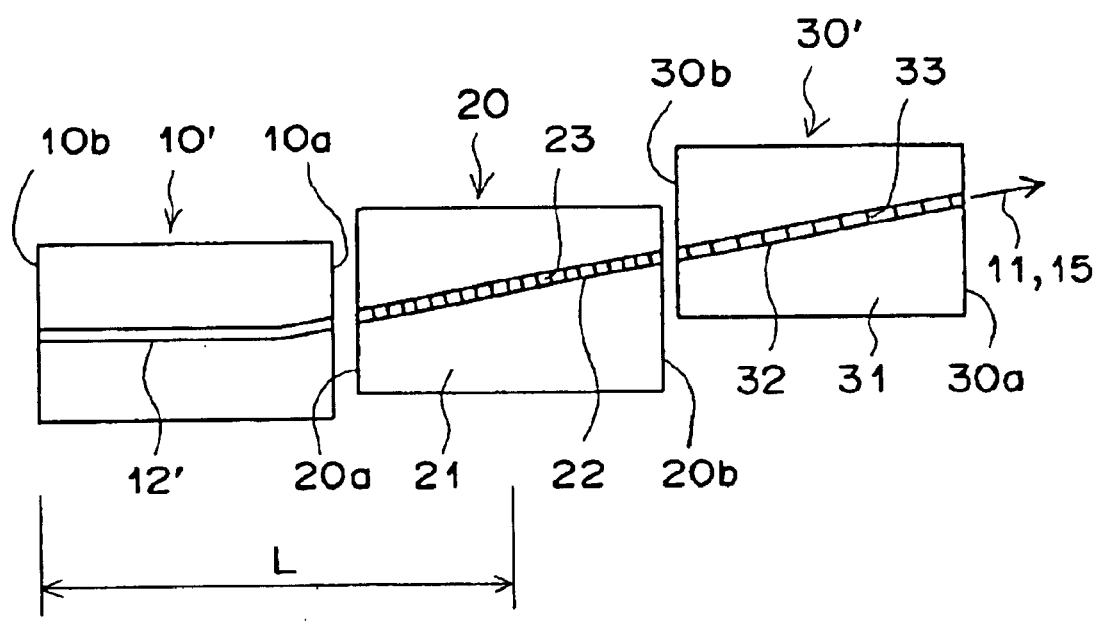

F I G . 16
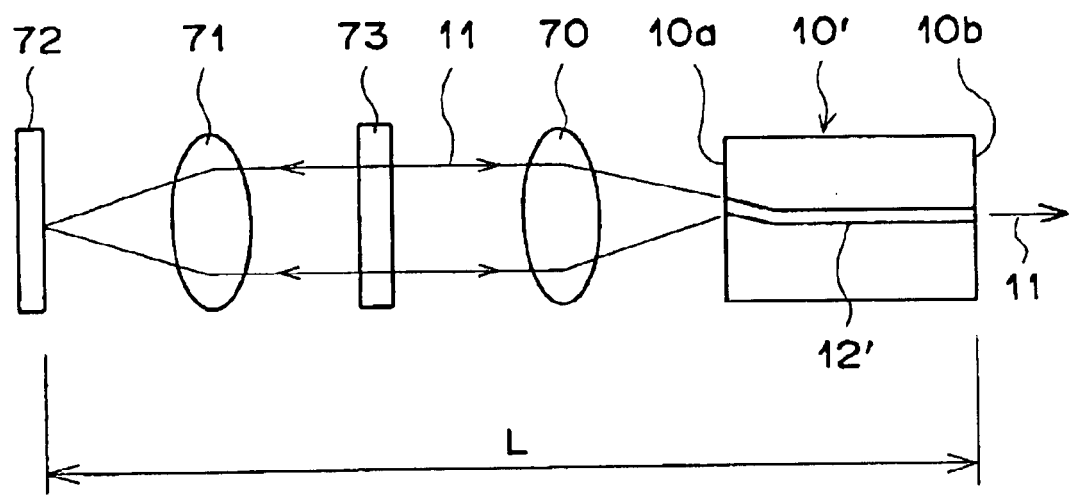

PRIOR ART

LASER LIGHT SOURCE

BACKGROUND OF THE INVENTION

1. Field of the Invention

The present invention relates to a laser light source, and more particularly to a laser light source from which light emitted from a semiconductor light-emitting device is emitted at a wavelength selected by an external resonator including a wavelength selector.

2. Description of the Related Art

A conventional laser light source is shown in Japanese Unexamined Patent Publication No. 10(1998)-254001 by way of example. The laser light source is constructed of a semiconductor light-emitting device (such as a semiconductor laser, etc.), and an external resonator having a wavelength selector (such as a narrow-band pass filter, etc.). The wavelength of a laser beam that is emitted is locked at a desired wavelength by operation of the external resonator. The external resonator can be constituted with an ordinary mirror, or a waveguide type wavelength selector in which, as disclosed in Japanese Patent Application No. 2000-19666, light is reflected at a wavelength selected by a reflection Bragg grating formed along an optical waveguide.

FIG. 17 shows a conventional laser light source equipped with the aforementioned waveguide type wavelength selector. The laser light source is constructed of a semiconductor laser chip 1, and a waveguide type wavelength selector 2 coupled directly to the front facet 1a of the semiconductor laser chip 1. The semiconductor laser chip 1 has a stripe 3, which includes an active region. The stripe 3 is formed perpendicular to both end facets (front facet 1a and rear facet 1b) of the semiconductor laser chip 1. The wavelength selector 2 consists of a channel type optical waveguide 4 formed in a ferroelectric substrate, and a distributed Bragg reflector (DBR) grating 5 formed in the optical waveguide 4 along the light propagation direction.

The front facet 1a of the semiconductor laser chip 1 is provided with an antireflection (AR) coating. Similarly, the end facets 2a, 2b of the wavelength selector 2 are provided with AR coatings, respectively. The rear facet 1b of the semiconductor laser chip 1 is provided with a high reflective (HR) coating.

In the aforementioned laser light source, light emitted from the semiconductor laser chip 1 is incident on the channel type optical waveguide 4 of the wavelength selector 2 and is reflected within the DBR grating 5. The DBR grating 5, and the rear facet 1b of the semiconductor laser 1 provided with a HR coating, constitute an external resonator. A laser beam 6 is emitted from the front facet 2b of the wavelength selector 2 at a wavelength that resonates in the resonator. Since the wavelength of the light reflected within the DBR grating 5 is selected according to the grating pitch, the emission wavelength is locked at a desired value in the emission gain of the semiconductor laser chip 1.

Japanese Unexamined Patent Publication No. 10(1998)-254001 discloses that an optical wavelength converter is coupled to a semiconductor light-emitting device and that a laser beam emitted from the light-emitting device is converted to a second harmonic by the optical wavelength converter. In this wavelength converter, for example, an optical waveguide extending in one direction is formed in a ferroelectric crystal substrate having a nonlinear optical effect, and domain-inverted portions inverting the direction of the spontaneous polarization of the substrate are periodically formed in the optical waveguide. In the optical waveguide, the fundamental wave traveling along the domain-inverted portions is converted to a second harmonic, etc.

In the aforementioned laser light source (where the external resonator equipped with the wavelength converter is combined with the semiconductor light-emitting device), even if the end facet, on the side of the wavelength selector, of the semiconductor light-emitting device is provided with an antireflection (AR) coating with a reflectance of about 0.1% which can be easily formed, the Fabry-Perot mode of the semiconductor light-emitting device tends to occur due to the residual reflection. Because of this, there is a problem that the Fabry-Perot mode will have an adverse effect on a longitudinal mode which is selected by the external resonator and will make the emission wavelength unstable.

More specifically, there are cases where the semiconductor light-emitting device oscillates at a wavelength differing from the wavelength of the feedback light from the wavelength selector to the semiconductor light-emitting device. In addition, there are cases where mode hops occur between the longitudinal mode of the external resonator and the longitudinal mode of a composite resonator (which is constituted with a Fabry-Perot resonator, constituted with both end faces of the semiconductor light-emitting device, and the external resonator) Furthermore, if the semiconductor light-emitting device is operated with high-frequency superposition in order to eliminate mode hops, it will result in disturbance. As a result, there are cases where the semiconductor light-emitting device oscillates at a wavelength differing from the wavelength of the feedback light from the wavelength selector to the semiconductor light-emitting device.

The aforementioned problems tend to occur particularly in the case where a high current is injected into the semiconductor light-emitting device to obtain high output, or the case where the longitudinal length of the semiconductor light-emitting device is relatively long and the gain has been increased.

Note that FIG. 18 schematically shows how the light output is fluctuated by the aforementioned mode hops. FIG. 19A schematically shows the emission spectrum of the laser light source when its light output is high; FIG. 19B schematically shows the emission spectrum of the laser light source when the light output is low.

To solve the aforementioned problems, a laser light source has been proposed which oscillates only at a wavelength selected by an external resonator. One such laser light source is disclosed in Jpn. J. Appl. Phys. Lett. 47(3), 1, Aug. 1985, pp. 183–185. In the laser light source, a semiconductor light-emitting device is coupled directly with an external resonator having a wavelength selector. The end facets that are coupled directly with each other are provided with coatings, which become AR coatings with respect to a wavelength selected by the external resonator. With this arrangement, a Fabry-Perot mode is not liable to occur between both end facets of the semiconductor light-emitting device, and consequently, a laser beam is liable to be emitted only by the external resonator. However, even if such a structure is adopted, it is fairly difficult to completely prevent the occurrence of the Fabry-Perot mode between both end faces of the semiconductor light-emitting device.

SUMMARY OF THE INVENTION

The present invention has been made in view of the circumstances mentioned above. Accordingly, it is the primary object of the present invention to provide a laser light source that is capable of emitting a stable laser light beam at a selected wavelength.

To achieve this end, there is provided a laser light source comprising:

a semiconductor light-emitting device for emitting light;

an external resonator including a wavelength selector which selects a wavelength of the light;

wherein a stripe is formed in the semiconductor light-emitting device so that it is oblique to one end facet, which does not constitute the external resonator, of the two cleaved end facets of the semiconductor light-emitting device; and the one end facet of the semiconductor light-emitting device has a coating which becomes an antireflection coating with respect to the selected wavelength.

In the laser light source of the present invention, there are cases where one of the aforementioned two end facets constitutes the external resonator, or there are cases where neither end facet constitutes the external resonator. In the former, it is necessary that the stripe be formed oblique to the end facet of the semiconductor light-emitting device which does not constitute the external resonator. In the latter, it is necessary that the stripe be formed oblique to either or both of the end facets.

In the laser light source of the present invention, it is desirable that the wavelength selector comprise two wavelength selectors, disposed on both sides of the semiconductor light-emitting device one by one, and having a function of returning the wavelength-selected light to the semiconductor light-emitting device. It is also desirable that the external resonator be constituted by the two wavelength selectors.

In the laser light source of the present invention, the wavelength selector may have a function of returning the wavelength-selected light to the semiconductor light-emitting device, and the external resonator may be constituted by the wavelength selector and an end facet, on the opposite side from the wavelength selector, of the semiconductor light-emitting device. In that case, the stripe of the semiconductor light-emitting device has a bent portion and is formed perpendicular to the end facet, on the opposite side from the wavelength selector, of the semiconductor light-emitting device (i.e., the end facet that constitutes the external resonator)

As described above, in the case where the external resonator is constituted by a single wavelength selector and the semiconductor light-emitting device, or by two wavelength selectors, an optical waveguide device having a wavelength converting function, for example, may be coupled to the semiconductor light-emitting device or wavelength selector.

In the laser light source of the present invention, the wavelength selector has a function of returning the wavelength-selected light to the semiconductor light-emitting device and is disposed on one side of the semiconductor light-emitting device. The optical waveguide device is disposed on the other side of the semiconductor light-emitting device, and the external resonator is constituted by an end facet, on the opposite side from the semiconductor light-emitting device, of the optical waveguide device, and the wavelength selector. In this case, it is preferable that the optical waveguide device have a wavelength converting function.

In the case where the optical waveguide device has a wavelength converting function, it is desirable that the width of the wavelength selected by the wavelength selector be nearly the same as an allowable phase-matching wavelength width for wavelength conversion.

It is desirable that the aforementioned optical waveguide device be disposed in the external resonator.

In the laser light source of the present invention, it is desirable that an end facet of the optical waveguide device constituting the external resonator be cut perpendicular to a direction where an optical waveguide of the optical waveguide device extends. It is also desirable that an end facet of the optical waveguide device not constituting the external resonator be cut oblique to a direction where an optical waveguide of the optical waveguide device extends.

It is preferable that the aforementioned optical waveguide be coupled directly to the semiconductor light-emitting device or wavelength selector.

In the laser light source of the present invention, it is preferable that the wavelength selector be a waveguide type wavelength selector having a reflection Bragg grating in an optical waveguide portion. It is also preferable that the wavelength selector and the semiconductor light-emitting device be coupled directly with each other. The same applies to the coupling between the waveguide type wavelength selector and the optical waveguide device. The expression "direct coupling" indicates that two devices are coupled together without a lens optics system, and includes the case where two devices are not in direct physical contact with each other.

In the laser light source of the present invention, the external resonator may be constituted by a mirror, disposed to face one end facet of the semiconductor light-emitting device, and the other end facet of the semiconductor light-emitting device. The wavelength selector may comprise a narrow-band pass filter disposed between the mirror and the semiconductor light-emitting device.

It is desirable that the laser light source of the present invention be provided with a drive circuit that drives the semiconductor light-emitting device with high-frequency superposition. In that case, it is desirable that a longitudinal mode width of the external resonator be less than the width of the wavelength selected by the wavelength selector. It is also desirable that the laser light source be operated in a multi-longitudinal mode which is within the width of the selected wavelength by the high-frequency superposition.

Furthermore, it is desirable that the laser light source of the present invention be provided with temperature control means for maintaining the devices, which constitute the external resonator, at a predetermined temperature.

According to the laser light source of the present invention, one end facet, which does not constitute the external resonator, of the two cleaved end facets of the semiconductor light-emitting device is provided with a coating which becomes an antireflection coating with respect to an emission wavelength. This can reduce the optical confinement between the two end facets. Therefore, the occurrence of the Fabry-Berot mode between the two end facets can be prevented.

In addition, according to the laser light source of the present invention, the stripe in the semiconductor light-emitting device is formed oblique to the end facet of the semiconductor light-emitting device not constituting the external resonator. Because of this, when light traveling along the stripe is reflected at the oblique end facet, it is reflected in a direction differing from the traveling direction. As a result, the occurrence of the Fabry-Berot mode between the two end facets can be further prevented. Thus, the laser light source of the present invention is oscillated only by the external resonator and is capable of emitting laser light at a wavelength, selected by the wavelength selector included in the external resonator.

BRIEF DESCRIPTION OF THE DRAWINGS

The present invention will be described in further detail with reference to the accompanying drawings wherein:

FIG. 5 is apart-fragmentary side view of a light source apparatus in which the laser light source of the first embodiment is mounted;

FIG. 8 is a graph schematically showing the driving current versus light output characteristic of the laser light source of the third embodiment when it is driven with high-frequency superposition;

FIG. 9 is a graph schematically showing the emission spectra of the laser light source of the third embodiment when it is driven with high-frequency superposition;

FIG. 11 is a diagrammatic plan view showing a laser light source constructed according to a fourth embodiment of the present invention;

FIG. 12 is a diagrammatic plan view showing a laser light source constructed according to a fifth embodiment of the present invention;

FIG. 14 is a diagrammatic plan view showing a laser light source constructed according to a seventh embodiment of the present invention;

FIG. 16 is a diagrammatic plan view showing a laser light source constructed according to a ninth embodiment of the present invention;

DESCRIPTION OF THE PREFERRED EMBODIMENTS

Figure 1:
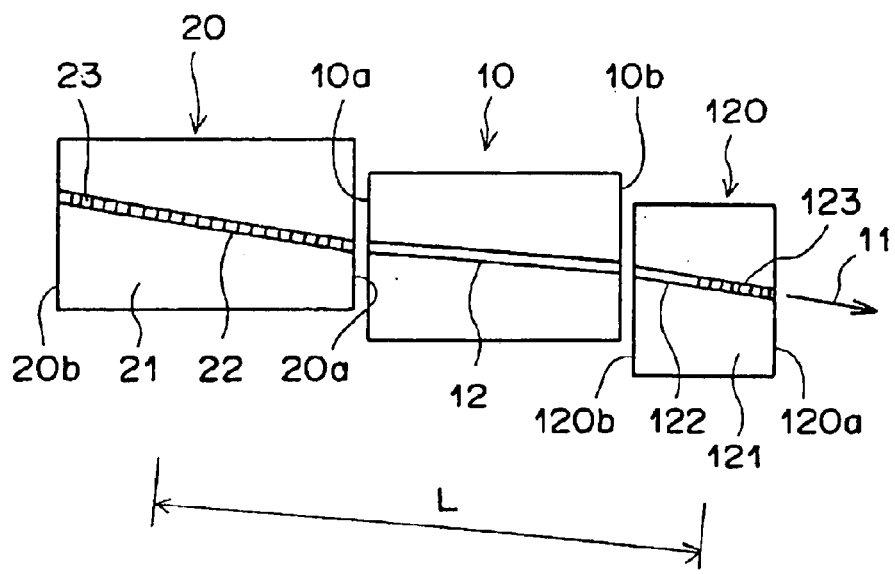
FIG. 1 is a diagrammatic plan view showing a laser light source constructed according to a first embodiment of the present invention.

Referring now in greater detail to the drawings and initially to FIG. 1, there is shown a laser light source in accordance with a first embodiment of the present invention. The laser light source of the first embodiment is constructed of a semiconductor laser chip 10, which is a semiconductor light-emitting element, for emitting a laser beam 11; a waveguide type wavelength selector 20 coupled directly to the cleaved rear facet 10a of the semiconductor laser chip 10; and a waveguide type wavelength selector 120 coupled directly to the front facet 10b of the semiconductor laser chip 10.

The semiconductor laser chip 10 has a stripe 12, which includes an active region and consists of an optical waveguide. The peak gain of the semiconductor laser chip 10 is at a wavelength of 1060 nm. The front facet 10b and the rear facet 10a of the semiconductor laser chip 10 have antireflection (AR) coatings whose reflectance is 0.5% or less with respect to a wavelength of 1060 nm, respectively. The longitudinal length (cavity length) of the semiconductor laser chip 10 is, for example, 0.75 mm and the effective refractive index of the optical waveguide of the stripe 12 is 3.35.

The stripe 12 of the semiconductor laser chip 10 is formed oblique to the front facet 10b and the rear facet 10a. In the first embodiment, the stripe 12 is inclined, for example, at an angle of 3° to a direction perpendicular to the rear facet 10a and the front facet 10b.

In the first wavelength selector 20, a $Si_3O_4$ channel type optical waveguide 22 is formed, for example, in a $SiO_2$ substrate 21, and along the light propagation direction in the channel type optical waveguide 22, a distributed Bragg reflector (DBR) grating 23 is formed.

The pitch Ag1 in the DBR grating 23 is expressed as $$\Lambda g1 = q\lambda/2N_{eff} (q=1, 2, 3, \ldots)$$

where λ is the wavelength of the light traveling along the DBR grating, and $N_{eff}$ is the effective refractive index of the channel type optical waveguide 22. In the first embodiment, with q=1, λ=1060 nm, and $N_{eff}$=1.53, the pitch Ag1 is set to 346 nm. With this setting, the DBR grating 23 will selectively reflect only light of wavelength λ=1060 nm. The device length (longitudinal length) of the first wavelength selector 20 is 6 mm, and the grating length is also 6 mm. The reflectance in the DBR grating 23 with respect to a wavelength of 1060 nm is 90%. In general, it is desirable that the reflectance be set to 90% or greater.

The front facet 20a of the first wavelength selector 20 that is coupled directly to the rear facet 10a of the semiconductor laser chip 10 has an AR coating whose reflectance is 0.5% or less with respect to a wavelength of 1060 nm. Similarly, the rear face 20b of the first wavelength selector 20 has an AR coating whose reflectance is 0.5% or less with respect to a wavelength of 1060 nm.

In the second wavelength selector 120, as with the first wavelength selector 20, a $Si_3O_4$ channel type optical waveguide 122 is formed in the same $SiO_2$ substrate 121 as the $SiO_2$ substrate 21 of the first wavelength selector 20, and a DBR grating 123 is formed along the light propagation direction in the channel type optical waveguide 122.

The effective refractive index $N_{eff}$ of the channel type optical waveguide 122, as with the channel type optical waveguide 22 of the first wavelength selector 20, is 1.53. Therefore, the pitch $\Lambda g2$ in the DBR grating 123 is similarly set to 346 nm. With this setting, the DBR grating 123 will selectively reflect only light of wavelength $\lambda$=1060 nm. The device length (longitudinal length) of the second wavelength selector 120 is 2 mm, and the grating length is 1 mm which is one-half the device length. The reflectance in the DBR grating 123 with respect to a wavelength of 1060 nm is 15%. Generally, it is desirable that the reflectance be set to a range of about 5 to 30%.

The rear facet 120b of the second wavelength selector 120 that is coupled directly to the front face 10b of the semiconductor laser chip 10 has an AR coating whose reflectance is 0.5% or less with respect to a wavelength of 1060 nm. Similarly, the front facet 120a of the second wavelength selector 120 has an AR coating whose reflectance is 0.5% or less with respect to a wavelength of 1060 nm.

As described above, the stripe 12 of the semiconductor laser chip 10 is formed oblique to the front and rear facets 10b, 10a. In the first embodiment, the channel type optical waveguide 22 of the first wavelength selector 20 is also formed oblique to the front facet 20a thereof so that Snell's law is satisfied between the light traveling through the stripe 12 and the light traveling through the channel type optical waveguide 22. As described previously, the inclination angle of the stripe 12 relative to the rear facet 10a is 3°, the effective refractive index of the optical waveguide constituting the stripe 12 is 3.34, and the effective refractive index of the channel type optical waveguide 22 is 1.53. Therefore, if the inclination angle of the channel type optical waveguide 22 with the respect to a direction perpendicular to the rear facet 20a of the first wavelength selector 20 is 6.58°, then Snell's law will be satisfied.

Similarly, the channel type optical waveguide 122 of the second wavelength selector 120 is formed oblique to the rear facet 120b so that Snell's law is satisfied between the light traveling through the stripe 12 and the light traveling through the channel type optical waveguide 122. The inclination angle of the channel type optical waveguide 122 with the respect to a direction perpendicular to the front facet 120a is 6.58°, the same as the channel type optical waveguide 22.

The first wavelength selector 20 is constructed so that the mode field diameter of the light traveling through the channel type optical waveguide 22 is nearly the same as the mode field diameter of the light emitted from the semiconductor laser chip 10. Similarly, the second wavelength selector 120 is constructed so that the mode field diameter of the light traveling through the channel type optical waveguide 122 is nearly the same as the mode field diameter of the light emitted from the semiconductor laser chip 10. These constructions make it possible to maximize the light coupling efficiency between the first wavelength selector 20 and the semiconductor laser chip 10 and the coupling efficiency between the semiconductor laser chip 10 and the second wavelength selector 120, respectively.

Between the first wavelength selector 20 and the semiconductor laser chip 10, the end plane (or facet) of the channel type optical waveguide 22 and the end plane (or facet) of the stripe 12 face each other so that the front facet 20a and the rear facet 10a are disposed in close proximity to each other. The gap between the front facet 20a and the rear facet 10a is 1.5 μm or less. Note that the first wavelength selector 20 and the semiconductor laser chip 10 may be disposed so that the front facet 20a and the rear facet 10a are in direct contact with each other. If the first wavelength selector 20 and the semiconductor laser chip 10 are disposed in direct contact with each other, they will be in a butt coupling state in which the light traveling through the first wavelength selector 20 and the light traveling through the semiconductor laser chip 10 are coupled with each other.

Likewise, between the second wavelength selector 120 and the semiconductor laser chip 10, the end plane (or facet) of the channel type optical waveguide 122 and the end plane (or facet) of the stripe 12 face each other so that the rear facet 120b and the front facet 10b are disposed in close proximity to each other. The gap between the rear facet 120b and the front facet 10b is 1.5 μm or less. Note that the rear facet 120b of the second wavelength selector 120 and the front facet 10b of the semiconductor laser chip 10 maybe disposed in direct contact with each other. If the second wavelength selector 120 and the semiconductor laser chip 10 are disposed in direct contact with each other, they will be in a butt coupling state in which the light traveling through the second wavelength selector 120 and the light traveling through the semiconductor laser chip 10 are coupled with each other.

Operation of the laser light source of the first embodiment will hereinafter be described. Under appropriate biasing conditions, light with a center wavelength of 1060 nm is emitted from the front facet 10b and the rear facet 10a of the semiconductor laser chip 10 in both directions. The light emitted from the rear facet 10a of the semiconductor laser chip 10 is incident on the first optical waveguide 22 of the first wavelength selector 20 and travels through the first optical waveguide 22. The light is reflected within the first DBR grating 23 and is returned to the semiconductor laser chip 10. While this is occurring, a wavelength of the light that is reflected is selected by the wavelength selecting operation of the first DBR grating 23. On the other hand, the light emitted from the front facet 10b of the semiconductor laser chip 10 is incident on the second optical waveguide 122 of the second wavelength selector 120 and travels through the second optical waveguide 122. The light is reflected within the second DBR grating 123 and is returned to the semiconductor laser chip 10. While this is occurring, a wavelength of the light that is reflected is selected by the wavelength selecting operation of the second DBR grating 123.

As described above, the light emitted from the semiconductor laser chip 10 turns back at the first wavelength selector 20 and the second wavelength selector 120. Because of this, the laser beam 11 is emitted at a wavelength that resonates between the first wavelength selector 20 and the second wavelength selector 120. A portion of the laser beam 11 passes through the DBR grating 123 of the second wavelength selector 120 whose reflectance is relatively low, and is emitted from the front facet 120a of the second wavelength selector 120. Since the wavelength of the light that is reflected within the DBR gratings 23, 123 is selected, the emission wavelength can be locked at a desired value in the emission gain of the semiconductor laser chip 10.

Particularly, in the laser light source of the first embodiment, the rear facet 10a of the semiconductor laser chip 10 and the front facet 20a of the first wavelength selector 20 have AR coatings, respectively. In addition, the front facet 10b of the semiconductor laser chip 10 and the rear facet 120b of the second wavelength selector 120 have AR coatings, respectively. Furthermore, the stripe 12 is formed oblique to the front facet 10b and the rear facet 10a of the semiconductor laser chip 10. Therefore, the laser light source of the first embodiment has practically no Fabry-Perot mode between both end facets 10a and 10b of the semiconductor laser chip 10. The detailed reason for that is as described previously.

In addition, the rear facet 20b of the first wavelength selector 20 and the front facet 120a of the second wavelength selector 120 have AR coatings, respectively. Therefore, the first embodiment has practically no Fabry-Perot mode between the front facet 10b of the semiconductor laser chip 10 and the rear facet 20b of the first wavelength selector 20 and between the rear facet 10a of the semiconductor laser chip 10 and the front facet 120a of the second wavelength selector 120.

That is, in the laser light source of the first embodiment, a Fabry-Perot type external resonator is formed between the DBR gratings 23 and 123 within which the laser beam 11 is reflected. Practically, the laser beam 11 is emitted only by the external resonator, and the emission wavelength becomes a wavelength selected by the resonator. Note in FIG. 1 that the range of the external resonator is indicated by an arrow L (the same applies to the following description).

More specifically, in the laser light source of the first embodiment, it has been observed that in a wide output range, particularly even at the time of high output, there is no light emission at wavelengths other than the wavelength selected by the wavelength selectors 20, 120. Therefore, the emission wavelength can be controlled with stability. That is, in a wide injection current range, the laser light source can be driven in a single longitudinal mode.

Figure 4A:
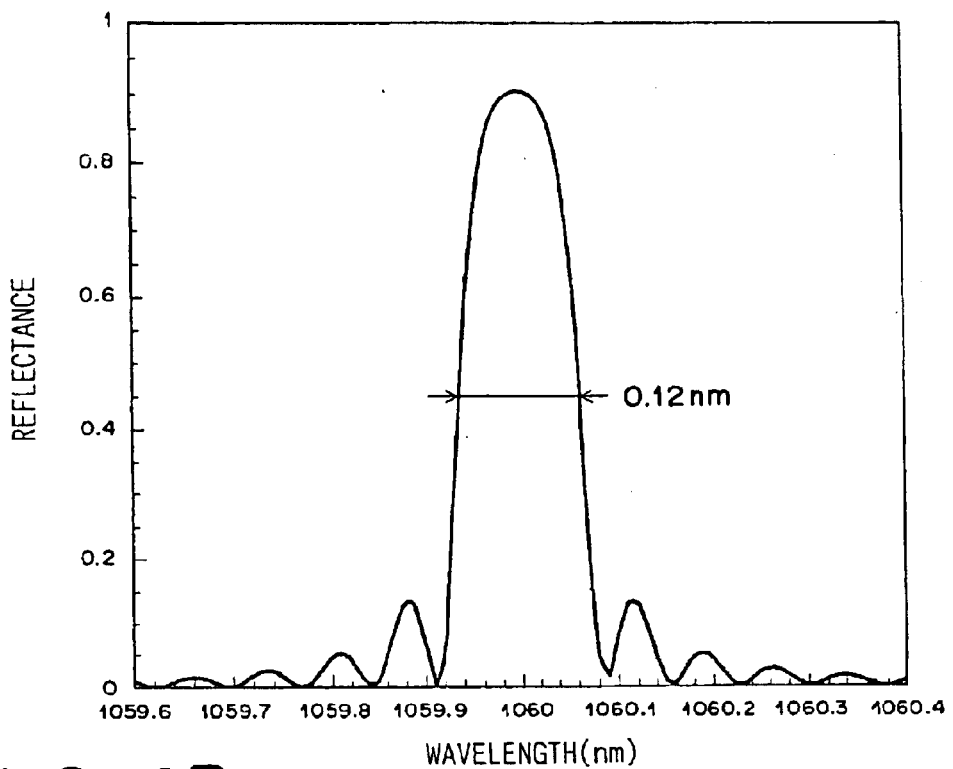
FIG. 4A is a graph showing the longitudinal mode width of the resonator used in the laser light source of the first embodiment.
Figure 4B:
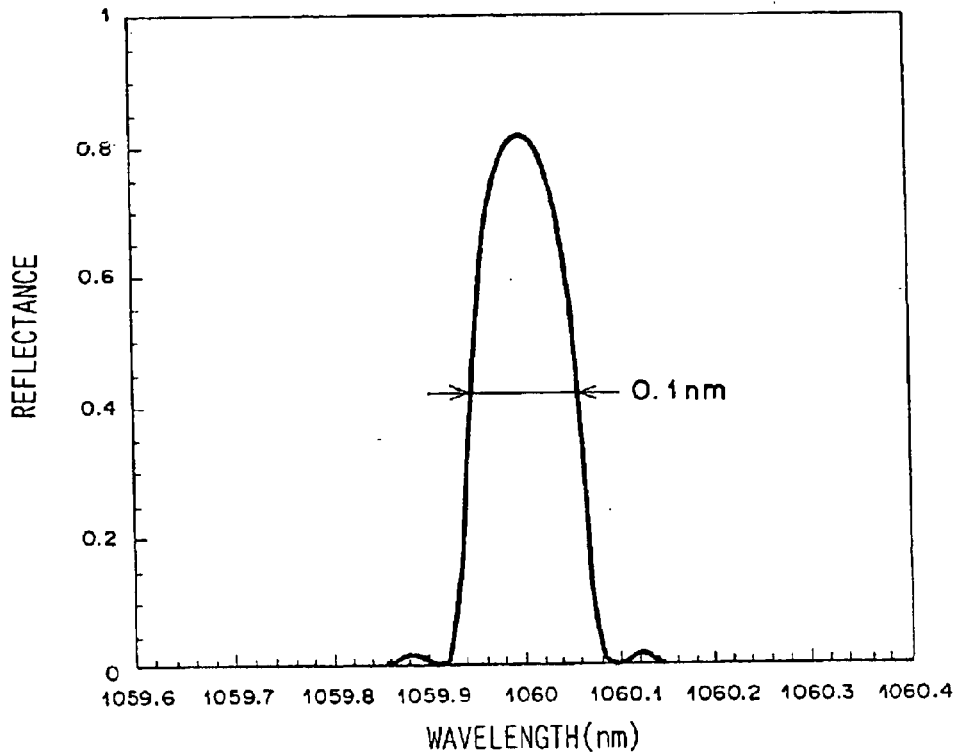
FIG. 4B is a graph showing the width of the wavelength selected by the resonator.

In the first embodiment, the longitudinal mode width of the resonator between the two wavelength selectors 20 and 120 is about 0.1 nm at a wavelength of 1060 nm, as shown in FIG. 4B. On the other hand, the width of the wavelength selected by the DBR gratings 23, 123 is given by the full width at half maximum intensity (FWHM). The FWHM is about 0.12 nm at a wavelength of 1060 nm, as shown in FIG. 4A. Thus, the selected wavelength width is nearly the same as the longitudinal mode width of the resonator. In the case where wavelength conversion is performed on the output light of the laser light source, it is desirable that the wavelength width of the output light be less than or equal to an allowable phase-matching wavelength width for wavelength conversion.

Figure 2A:
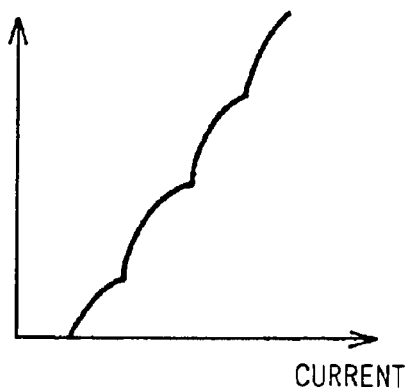
FIG. 2A is a graph schematically showing the driving current versus light output characteristic of the laser light source of the first embodiment when it is driven without high-frequency superposition.
Figure 2B:
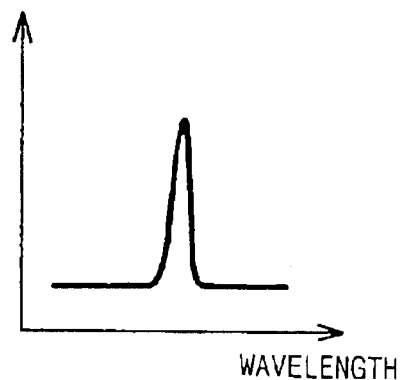
FIG. 2B is a graph schematically showing the emission spectrum of the laser light source of the first embodiment when it is driven without high-frequency superposition.
Figure 19A:
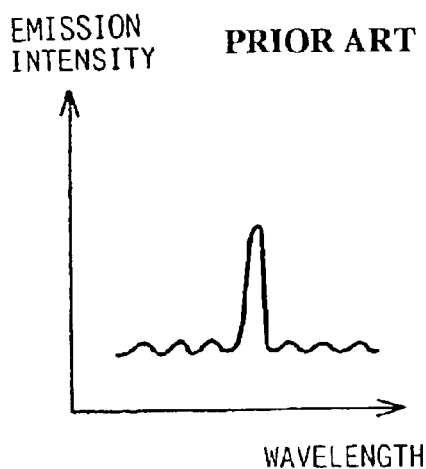
FIG. 19A is a graph schematically showing the emission spectrum of the laser light source of FIG. 17 when its light output is relatively low.
Figure 19B:
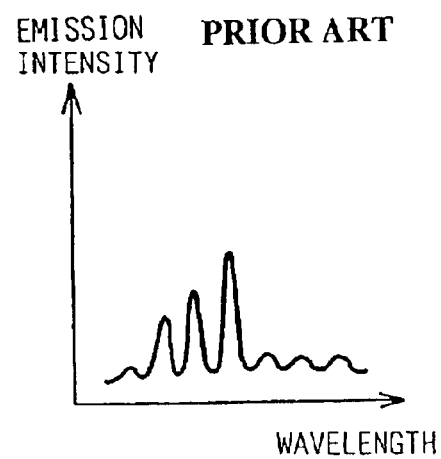
FIG. 19B is a graph schematically showing the emission spectrum of the laser light source of FIG. 17 when its light output is relatively high.

FIG. 2A schematically shows the driving current versus light output characteristic of the laser light source of the first embodiment when it is normally driven without high-frequency superposition; FIG. 2B schematically shows the emission spectrum of the laser light source when it is normally driven without high-frequency superposition. The hop of the longitudinal mode resulting from a change in the resonator length caused by current injection is relatively smooth. Because of this, as shown in FIG. 2A, the output fluctuation due to a mode hop is suppressed to a small amount, and a current range where light outputs become stable can be assured in a relatively wide range. In addition, if FIG. 2B is compared with FIGS. 19A and 19B described previously, it will be found that the laser light source of the first embodiment is stable in a single longitudinal mode.

Figure 3A:
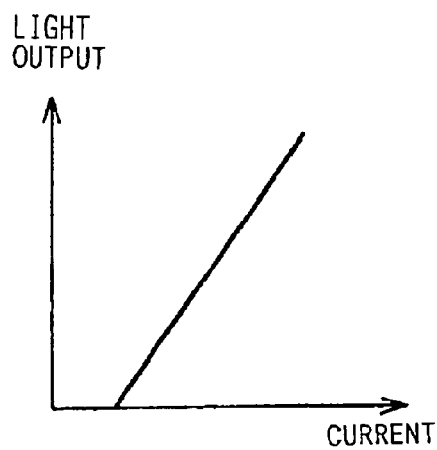
FIG. 3A is a graph schematically showing the driving current versus light output characteristic of the laser light source of the first embodiment when it is driven with high-frequency superposition.
Figure 3C:
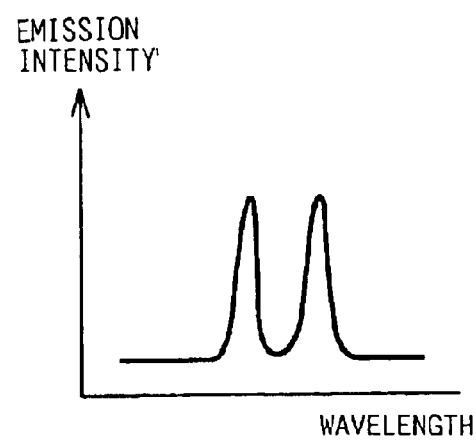
FIG. 3C is a graph schematically showing the emission spectrum of the laser light source when a mode is switched.
Figure 3B:
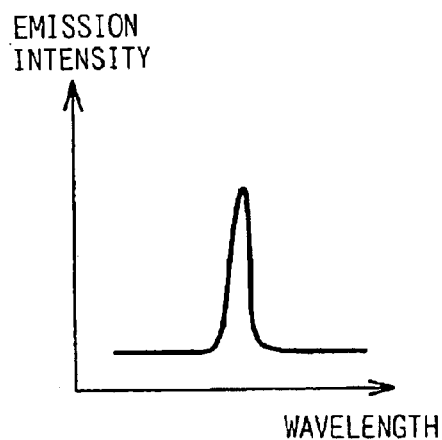
FIG. 3B is a graph schematically showing the emission spectrum of the laser light source of the first embodiment when it is driven with high-frequency superposition.

FIGS. 3A and 3B schematically show the driving current versus light output characteristic and the emission spectrum of the laser light source of the first embodiment when it is driven with high-frequency superposition, respectively. As can be clearly seen from FIG. 3A, the light output fluctuation due to mode hops is suppressed, compared with the case of FIG. 2A where high-frequency superposition is not performed. Thus, the driving current versus light output characteristic is stable. Therefore, even if high-frequency superposition is performed, there is no possibility that laser light will be emitted at wavelengths other than the selected wavelength, except the case of FIG. 3C where light is emitted at two wavelengths when a mode is switched, unlike the case of the conventional laser light source shown in FIG. 19B. Therefore, the laser light source of the first embodiment can be stably operated in a single longitudinal mode, as shown in FIG. 3B.

In the laser light source of the first embodiment, strong wavelength selectivity is obtained, because the external resonator is constructed with the two wavelength selectors 20, 120 disposed on both sides of the semiconductor laser chip 10.

The first embodiment employs the wavelength selector, disclosed in the specifications of Japanese Patent Application Nos. 2000-085973 and 2000-085974, which consists of a channel type optical waveguide and a DRB grating, formed on a $SiO_2$ substrate. However, the present invention can also employ, for example, a wavelength selector consisting of a channel optical guide and a DBR grating, formed on a MgO-LN (MgO doped $LiNbO_3$) substrate.

FIG. 5 shows a light source apparatus in which the laser light source of the first embodiment is mounted. In the light source apparatus, as shown in the figure, the semiconductor laser chip 10, first wavelength selector 20, and second wavelength selector 120 of the laser light source of the first embodiment are held by blocks 41, 42, and 43, respectively. Each block consists of metal whose thermal conductivity is high, such as copper, etc. The metal blocks 42, 43 are fixed to the metal block 41, which is in turn mounted on the top surface (temperature control surface) of a Peltier element 50.

The positional relationship between the blocks 41 and 42 and the positional relationship between the blocks 41 and 43 are adjusted so that light beams are coupled in the maximum efficiency between the channel type optical waveguide 22 of the first wavelength selector 22 and the stripe 12 of the semiconductor laser chip 10, and between the stripe 12 of the semiconductor laser chip 10 and the channel type optical waveguide 122 of the second wavelength selector 120.

In addition, the light source apparatus is provided with a collimator lens 45 for collimating the laser beam 11 emitted divergently from the second wavelength selector 120, a beam splitter 46 for dividing the collimated laser beam 11 into two separate beams, and a photodetector 51, which consists of a photodiode, etc., for detecting the intensity of the separate beam.

To avoid the influence of dust and dirt, the components described above are housed within a package, which consists of a package base 60 and a package cover 61 mounted on the base 60. The laser beam 11 transmitted through the beam splitter 46 is transmitted through a window glass 62 provided in the package cover 61 and is emitted outside the package cover 61, and is employed for a predetermined application.

The light source apparatus is further provided with a thermistor 52 for detecting a temperature near the external resonator constructed of the DBR gratings 23, 123 of the wavelength selectors 20, 120. A temperature detection signal S1 from the thermistor 52 is input to a temperature control circuit 53. The temperature control circuit 53 inputs a Peltier-element control signal S2, which corresponds to the temperature detection signal S1, to the Peltier element 50 and then controls operation of the Peltier element 50. With this arrangement, the temperature near the external resonator is maintained constant, and the emission wavelength fluctuation resulting from the resonator length change due to temperature change is prevented with reliability.

A light-intensity detection signal S3 output by the photodetector 51 is fed back to a semiconductor-laser control circuit 54. In response to the light-intensity detection signal S3, the semiconductor-laser control circuit 54 change the value of a driving current S4 that is supplied to the semiconductor laser chip 10, and thereby controls the output of the laser beam 11 to a predetermined value.

In the light source apparatus employing the laser light source of the first embodiment, single longitudinal mode operation can be performed over a wide injection-current range. Therefore, even if the value of the driving current S4 is changed to control the output of the laser beam 11 to a predetermined value, there is no possibility that mode hops will occur, and consequently, the occurrence of noise due to mode hops can be prevented.

In the case where the light source apparatus is applied to the recording light source of a gradation image forming apparatus, the reproducibility of the light output modulated in performing direct modulation with a high-frequency superposition operation becomes extremely satisfactory.

Figure 6:
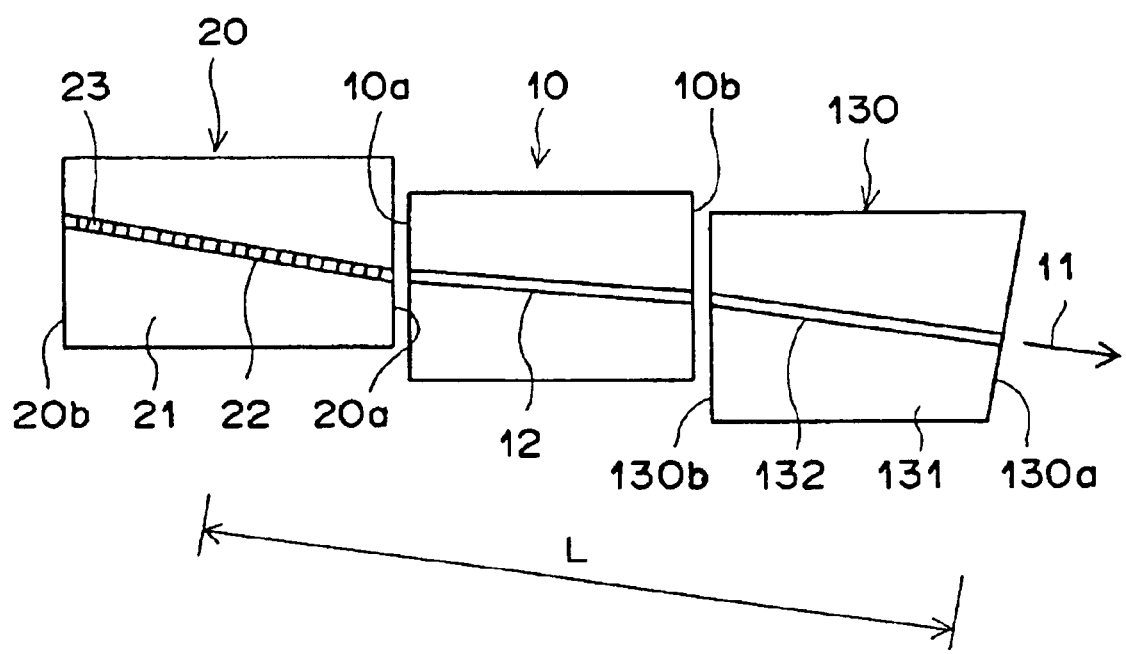
FIG. 6 is a diagrammatic plan view showing a laser light source constructed according to a second embodiment of the present invention.

FIG. 6 shows a laser light source constructed according to a second embodiment of the present invention. Note in the figure that the same reference numerals will be applied to the same parts as those in FIG. 1 to avoid redundancy (the same applies to the following description).

The laser light source of the second embodiment differs from the first embodiment of FIG. 1 in that instead of the second wavelength selector 120, an optical waveguide device 130 is coupled directly to the front facet 10b of a semiconductor laser chip 10. The remaining construction is basically the same as that of FIG. 1.

The optical waveguide device 130 consists of a MgO-LN substrate 131, and a channel type optical waveguide 132 formed in the MgO-LN substrate 131. The effective refractive index of the channel type optical waveguide 132 is 2.2 by way of example.

The rear facet 130b of the optical waveguide device 130 that is coupled directly to the front face 10b of the semiconductor laser chip 10 has an AR coating whose reflectance is 0.5% or less with respect to an emission wavelength of 1060 nm. On the other hand, the front facet 130a of the optical waveguide device 130 has a low reflective (LR) coating whose reflectance is about 5 to 30% with respect to an emission wavelength of 1060 nm.

The stripe 12 of the semiconductor laser chip 10 in the second embodiment is similarly formed oblique to the front and rear facets 10b, 10a. In the second embodiment, the channel type optical waveguide 132 of the optical waveguide device 130 is also formed oblique to the rear facet 130b thereof so that Snell's law is satisfied between the light traveling through the stripe 12 and the light traveling through the channel type optical waveguide 132. On the other hand, the front facet 130a of the optical waveguide device 130 is cut perpendicular to the channel type optical waveguide 132 so that the light reflected at the front facet 130a turns back in the direction opposite to the traveling direction of the light.

The optical waveguide device 130 is constructed so that the mode field diameter of the light traveling through the channel type optical waveguide 132 thereof is nearly the same as the mode field diameter of the light emitted from the semiconductor laser chip 10. This construction renders it possible to maximize the light coupling efficiency between the semiconductor laser chip 10 and the optical waveguide device 130.

Between the optical waveguide device 130 and the semiconductor laser chip 10, the end plane (or facet) of the channel type optical waveguide 132 and the end plane (or facet) of the stripe 12 face each other so that the rear facet 130b and the front facet 10b are disposed in close proximity to each other. The gap between the rear facet 130b and the front facet 10b is 1.5 $\mu$m or less. Note that the optical waveguide device 130 and the semiconductor laser chip 10 may be disposed so that the rear facet 130b and the front facet 10b are in direct contact with each other. If the optical waveguide device 130 and the semiconductor laser chip 10 are disposed in direct contact with each other, they will be in a butt coupling state in which the light traveling through the optical waveguide device 130 and the light traveling through the semiconductor laser chip 10 are coupled with each other.

Operation of the laser light source of the second embodiment will hereinafter be described. Under appropriate biasing conditions, light with a center wavelength of 1060 nm is emitted from the front facet 10b and the rear facet 10a of the semiconductor laser chip 10 in both directions. The light emitted from the rear facet 10a of the semiconductor laser chip 10 is incident on the optical waveguide 22 of the wavelength selector 20 and travels through the optical waveguide 22. The light is reflected within the DBR grating 23 and is returned to the semiconductor laser chip 10. While this is occurring, a wavelength of the light that is reflected is selected by the wavelength selecting operation of the DBR grating 23. On the other hand, the light emitted from the front facet 10b of the semiconductor laser chip 10 is incident on the optical waveguide 132 of the optical waveguide device 130 and travels through the optical waveguide 132. A portion of the light is reflected at the front facet 130a of the optical waveguide device 130 and is returned to the semiconductor laser chip 10.

As described above, the light emitted from the semiconductor laser chip 10 turns back at the DBR grating 23 of the wavelength selector 20 and the front facet 130a of the optical waveguide device 130. Because of this, the laser beam 11 is emitted at a wavelength that resonates between the DBR grating 23 of the wavelength selector 20 and the front facet 130a of the optical waveguide device 130. A portion of the laser beam 11 is emitted from the front facet 130a of the optical waveguide device 130. Since the wavelength of the light that is reflected within the DBR grating 23 is selected, the emission wavelength can be locked at a desired value in the emission gain of the semiconductor laser chip 10.

Particularly, in the laser light source of the second embodiment, the rear facet 10a of the semiconductor laser chip 10 and the front facet 20a of the wavelength selector 20 have AR coatings, respectively. In addition, the front facet 10b of the semiconductor laser chip 10 and the rear facet 130b of the optical waveguide device 130 also have AR coatings, respectively. Furthermore, the stripe 12 is formed oblique to the front facet 10b and the rear facet 10a of the semiconductor laser chip 10. Therefore, the laser light source of the second embodiment has practically no Fabry-Perot mode between both end facets 10a and 10b of the semiconductor laser chip 10. The detailed reason for that is as described previously.

In addition, the rear facet 20b of the wavelength selector 20 and the front facet 130a of the optical waveguide device 130 have AR coatings, respectively. Therefore, the laser light source of the second embodiment has practically no Fabry-Perot mode between the front facet 10b of the semiconductor laser chip 10 and the rear facet 20b of the wavelength selector 20 and between the rear facet 10a of the semiconductor laser chip 10 and the front facet 130a of the optical waveguide device 130.

That is, in the laser light source of the second embodiment, a Fabry-Perot type external resonator is formed between the DBR grating 23, within which the laser beam 11 is reflected, and the front facet 130a of the optical waveguide device 130. Practically, the laser beam 11 is emitted only by the external resonator, and the emission wavelength becomes a wavelength selected by the DBR grating 23.

The second embodiment employs the optical waveguide device 130, which consists of the MgO-LN substrate 131 and the channel type optical waveguide 132 formed in the MgO-LN substrate 131. However, the present invention can employ, for example, an optical waveguide device that includes a channel type optical waveguide, formed in the aforementioned silicon or quartz substrate, and consisting of a core material whose refractive index is about 1.75 to 2.3.

Figure 7:
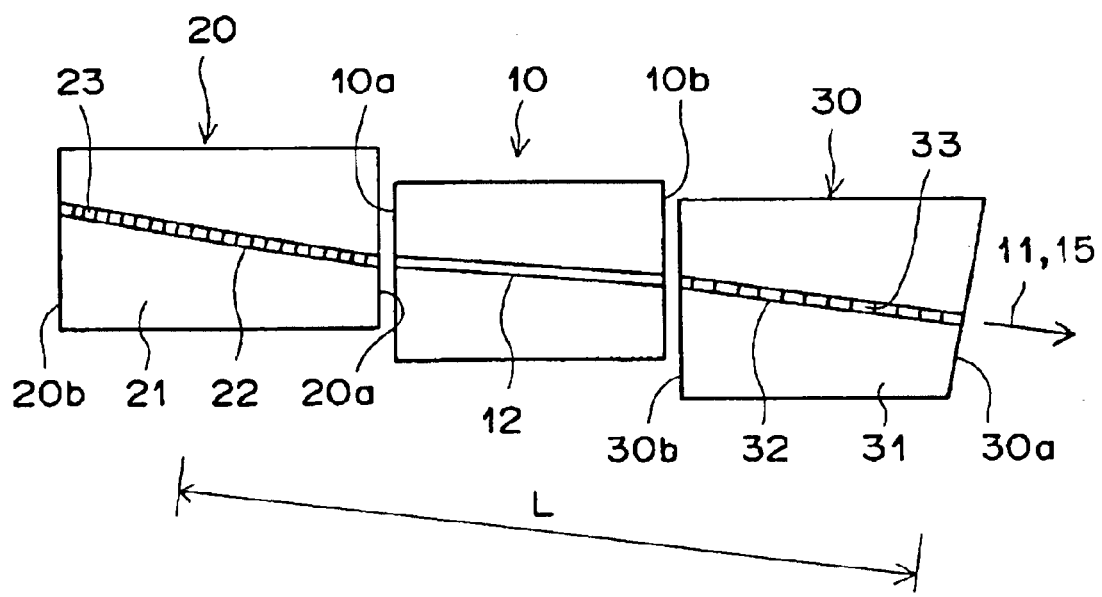
FIG. 7 is a diagrammatic plan view showing a laser light source constructed according to a third embodiment of the present invention.

FIG. 7 shows a laser light source constructed according to a third embodiment of the present invention. The laser light source of the third embodiment differs from the second embodiment of FIG. 6 in that instead of the optical waveguide device 130, a waveguide type optical wavelength converter 30 is coupled directly to the front facet 10b of a semiconductor laser chip 10. The remaining construction is basically the same as that of FIG. 6.

The optical wavelength converter 30 consists of an MgO-LN substrate 31 having a nonlinear optical effect, a periodic domain-inverted structure, where domain-inverted portions 33 inverting the direction of spontaneous polarization parallel to the Z-axis are periodically formed, and a channel type optical waveguide 32 extending along the periodic domain-inverted structure. The effective refractive index of the channel type optical waveguide 32 is 2.2 by way of example.

The rear facet 30b of the optical wavelength converter 30 that is coupled directly to the front face 10b of the semiconductor laser chip 10 has an AR coating whose reflectance is 0.5% or less with respect to the laser beam 11 of wavelength 1060 nm. On the other hand, the front facet 30a of the optical wavelength converter 30 has a coating, which becomes a high reflective (HR) coating with respective to the laser beam 11 and becomes an AR coating with respect to a second harmonic to be described later.

The stripe 12 of the semiconductor laser chip 10 in the third embodiment is similarly formed oblique to the front and rear facets 10b, 10a. In the third embodiment, the channel type optical waveguide 32 of the optical wavelength converter 30 is also formed oblique to the rear facet 30b thereof so that Snell's law is satisfied between the light traveling through the stripe 12 and the light traveling through the channel type optical waveguide 32. On the other hand, the front facet 30a of the optical wavelength converter 30 is cut perpendicular to the channel type optical waveguide 32 so that the light reflected at the front facet 30a turns back in the direction opposite to the traveling direction of the light.

The optical wavelength converter 30 is constructed so that the mode field diameter of the light traveling through the channel type optical waveguide 32 thereof is nearly the same as the mode field diameter of the light emitted from the semiconductor laser chip 10. This construction makes it possible to maximize the light coupling efficiency between the semiconductor laser chip 10 and the optical wavelength converter 30.

Between the optical wavelength converter 30 and the semiconductor laser chip 10, the end plane (or facet) of the channel type optical waveguide 32 and the end plane (or facet) of the stripe 12 face each other so that the rear facet 30b and the front facet 10b are disposed in close proximity to each other. The gap between the rear facet 30b and the front facet 10b is 1.5 $\mu$m or less. Note that the optical wavelength converter 30 and the semiconductor laser chip 10 may be disposed so that the rear facet 30b and the front facet 10b are in direct contact with each other. If the optical wavelength converter 30 and the semiconductor laser chip 10 are disposed in direct contact with each other, they will be in a butt coupling state in which the light traveling through the optical wavelength converter 30 and the light traveling through the semiconductor laser chip 10 are coupled with each other.

Operation of the laser light source of the third embodiment will hereinafter be described. Under appropriate biasing conditions, light with a center wavelength of 1060 nm is emitted from the front facet 10b and the rear facet 10a of the semiconductor laser chip 10 in both directions. The light emitted from the rear facet 10a of the semiconductor laser chip 10 is incident on the optical waveguide 22 of the wavelength selector 20 and travels through the optical waveguide 22. The light is reflected within the DBR grating 23 and is returned to the semiconductor laser chip 10. When this is occurring, a wavelength of the light that is reflected is selected by the wavelength selecting operation of the DBR grating 23. On the other hand, the light emitted from the front facet 10b of the semiconductor laser chip 10 is incident on the optical waveguide 32 of the optical wavelength converter 30 and travels through the optical waveguide 32. The greater part of the light is reflected at the front facet 30a of the optical wavelength converter 30 and is returned to the semiconductor laser chip 10.

As described above, the light emitted from the semiconductor laser chip 10 turns back at the DBR grating 23 of the wavelength selector 20 and the front facet 30a of the optical wavelength converter 30. Because of this, the laser beam 11 is emitted at a wavelength that resonates between the DBR grating 23 of the wavelength selector 20 and the front facet 30a of the optical wavelength converter 30. The laser beam 11 is incident on the optical wavelength converter 30 as a fundamental wave, and pseudo phase matching is performed by the aforementioned periodic domain-inverted structure. As a result, the laser beam 11 is converted to a second harmonic 15 whose wavelength is one-half the fundamental wavelength. The second harmonic 15 is emitted from the front facet 30a of the optical wavelength converter 30.

In the third embodiment, as with the first embodiment, it has been observed that in a wide output range, particularly even at the time of high output, there is no light emission at wavelengths other than the wavelength selected by the wavelength selectors 20, 120. Therefore, the emission wavelength can be controlled with stability. That is, in a wide injection current range, the emission wavelength can be controlled so that it is within an allowable wavelength width for wavelength conversion.

In the third embodiment, the longitudinal mode width of the external resonator is about 0.02 nm at a wavelength of 1060 nm. On the other hand, the width of the wavelength selected by the DBR grating 23 is given by the full width at half maximum intensity (FWHM). The FWHM is about 0.12 nm at a wavelength of 1060 nm. The allowable phase-matching wavelength width of the wavelength conversion in the optical wavelength converter 30 is likewise 0.12 nm. In the third embodiment, the emission wavelength of the laser beam 11 that is a fundamental wave is stable within the allowable phase-matching wavelength width of the wavelength conversion, so the second harmonic 15 can be obtained as a stable output. In addition, since the optical wavelength converter 30 is disposed in the external resonator, the longitudinal mode width of the external resonator can be narrowed. This makes stable multi-mode emission possible.

FIG. 8 shows the relationship between the driving current and the second harmonic output of the laser light source of the third embodiment when it is driven with high-frequency superposition. FIG. 9 shows the emission spectra of the laser light source of the third embodiment when it is driven with high-frequency superposition. As shown in FIG. 8, discontinuous output changes due to mode hops are suppressed and therefore the second harmonic output becomes stable. In addition, as shown in FIG. 9, even when the laser light source is perturbed by high-frequency superposition, light emission at wavelengths other than the wavelength selected by the wavelength selector 20 is not observed and therefore emission wavelength can be controlled with stability.

In the case where the laser beam 11 is converted to the second harmonic 15 and is output, there is a possibility that the second harmonic output will be greatly fluctuated due to a mode hop resulting from a change in the emission wavelength of the semiconductor laser chip 10 and that the reproducibility of the driving current versus second harmonic output will be considerably degraded, because the second harmonic output is proportional to the square of the fundamental wave output. However, in the third embodiment, since emission wavelength changes and mode hops can be suppressed with reliability, the effect of being able to prevent an output fluctuation in the second harmonic 15 becomes extremely high.

Figure 10:
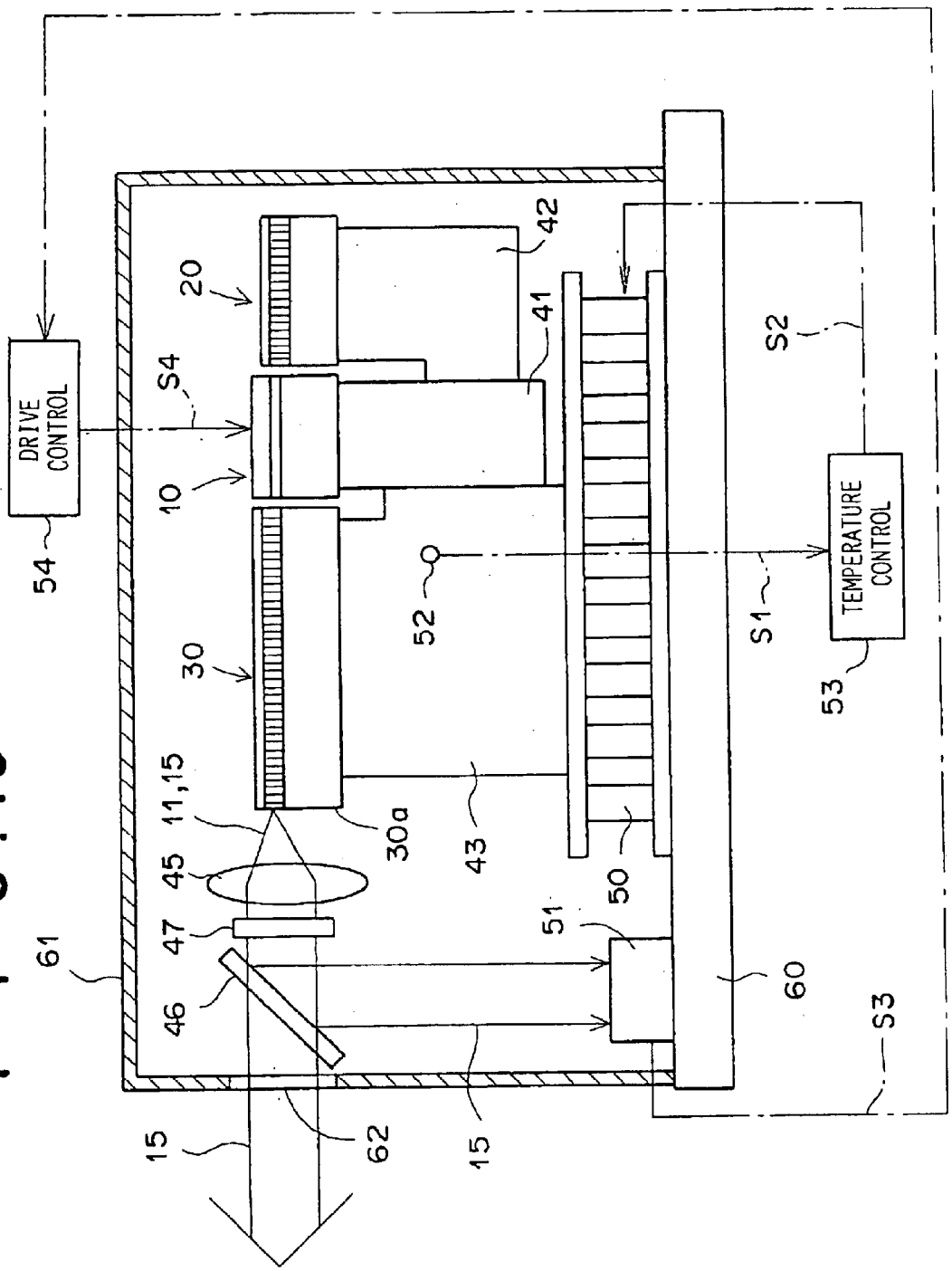
FIG. 10 is apart-fragmentary side view of a light source apparatus in which the laser light source of the third embodiment is mounted.

FIG. 10 shows a light source apparatus in which the laser light source of the third embodiment is mounted. In the light source apparatus, as shown in the figure, the semiconductor laser chip 10 and the wavelength selector 20 are held by blocks 41 and 42, respectively. The blocks 41, 42 consist of metal whose thermal conductivity is high, such as copper, etc. The optical wavelength converter 30 is also held by a block 43 consisting of metal whose thermal conductivity is high, such as copper, etc. The metal block 42 is fixed to the metal block 41, which is in turn fixed to the metal block 43. The metal block 43 is mounted on the top surface (temperature control surface) of a Peltier element 50. A wavelength that is selected by the wavelength selector 20 is changed by the temperature of the wavelength selector 20. Because of this, the emission wavelength of the semiconductor laser chip 10 is changed. To prevent this change, it is preferable to control the temperatures of the components of the external resonator.

A laser beam 11, incident on the optical wavelength selector 30 as a fundamental wave, and a second harmonic 15 are emitted from the front facet 30a of the optical wavelength selector 30. However, the laser beam 11 is cut off by a fundamental-wave cut filter 47 disposed between a collimator lens 45 and a beam splitter 46. Therefore, in the third embodiment, the light intensity of one of the two separate second harmonics 15 divided by the beam splitter 46 is detected by a photodetector 51, and operation of the semiconductor laser chip 10 is controlled by a semiconductor-laser control circuit 54 so that the light intensity of the second harmonic 15 becomes a predetermined value.

In the laser light apparatus shown in FIG. 10, the wavelength of the laser beam 11 (which is a fundamental wave) is 1060 nm, and as described above, the wavelength of the second harmonic is one-half the fundamental wavelength. Therefore, the second harmonic 15 becomes green light of wavelength 530 nm. However, the present invention is not limited to the wavelength 1060 nm. For instance, in the case where blue light of wavelength 470 nm is required, the light source apparatus of the present invention can employ (1) a semiconductor light-emitting device having a gain peak of 940 nm, (2) a wavelength selector in which a selected wavelength becomes 940 nm, and (3) an optical wavelength converter including a wavelength of 940 nm in an allowable phase-matching wavelength width for wavelength conversion.

FIG. 11 shows a laser light source constructed according to a fourth embodiment of the present invention. In the laser light source of the fourth embodiment, as shown in the figure, the same wavelength selector 20 as that employed in the laser light source of FIG. 1 is coupled directly with a semiconductor laser chip 10' similar to the semiconductor laser chip 10 employed in the laser light source of FIG. 1.

The semiconductor laser chip 10' differs from the semiconductor laser chip 10 of FIG. 1 in that a stripe 12' has a bent portion and that the front facet 10b of the wavelength selector 20 has an LR coating whose reflectance is about 5 to 30% with respect to an emission wavelength of 1060 nm.

The stripe 12', in addition to the aforementioned bent portion, has a straight portion perpendicular to the front facet 10b thereof. The inclination angle of the bent portion of the stripe 12' with respect to the rear facet 10a thereof is formed so that Snell's law is satisfied between the light traveling through the stripe 12' and the light traveling through the channel type optical waveguide 22 of the wavelength selector 20.

In the laser light source of the fourth embodiment, a portion of the light emitted from the semiconductor laser chip 10' is reflected at the front facet 10b and turns back in the direction opposite to the traveling direction of the light. In this manner, an external resonator is formed by the front facet 10b of the semiconductor laser chip 10' and the DBR grating 23 of the wavelength selector 20. The emission wavelength is locked at a wavelength selected by the DBR grating 23. The laser beam 11 oscillated in this manner is emitted from the front facet 10b of the semiconductor laser chip 10'.

In the laser light source of the fourth embodiment, as with the first embodiment, AR coatings are formed on the front facet 20a of the wavelength selector 20 and the rear facet 10a of the semiconductor laser chip 10 and, in addition, the stripe 12' is formed oblique to the rear facet 10a of the semiconductor laser chip 10'. Therefore, the laser light source of the fourth embodiment has practically no Fabry-Perot mode between both end facets 10a and 10b of the semiconductor laser chip 10'.

FIG. 12 shows a laser light source constructed according to a fifth embodiment of the present invention. In the laser light source of the fifth embodiment, as shown in the figure, a first wavelength selector 20 (which is the same as that employed in the laser light source of FIG. 1), a semiconductor laser chip 10' (which is similar to the semiconductor laser chip 10 employed in the laser light source of FIG. 1), an optical wavelength selector 30'(which is similar to the optical wavelength selector 30 employed in the laser light source of FIG. 7), and a second wavelength selector 20 (which is the same as the first wavelength selector 20), are directly coupled in the recited order.

The semiconductor laser chip 10" differs from the semiconductor laser chip 10 of FIG. 1 in that a stripe 12" has two bent portions. The angle of the rear bent portion of the stripe 12" with respect to the rear facet 10a thereof is formed so that Snell's law is satisfied between the light traveling through the stripe 12" and the light traveling through the channel type optical waveguide 22 of the wavelength selector 20. Similarly, the angle of the front bent portion of the stripe 12" with respect to the front facet 10b thereof is formed so that Snell's law is satisfied between the light traveling through the stripe 12" and the light traveling through the channel type optical waveguide 32 of the optical wavelength converter 30'.

The optical wavelength converter 30' differs from the optical wavelength converter 30 employed in the laser light source of FIG. 7, in that the front facet 30a is not obliquely cut (that is, it is not formed perpendicular to the channel type optical waveguide 32) and that the front facet 30a has a coating which becomes an AR coating with respect to the emission wavelength of the laser light source.

In the laser light source of the fifth embodiment, a portion of the light emitted from the rear facet 10a of the semiconductor laser chip 10" is reflected within the DBR grating 23 of the first wavelength selector 20. Similarly, a portion of the light emitted from the front facet 10b of the semiconductor laser chip 10" is reflected within the DBR grating 23 of the second wavelength selector 20. That is, in the fifth embodiment, an external resonator is formed by the DBR gratings 23, 23 of the two wavelength selectors 20, 20. The emission wavelength is locked at a wavelength selected by the DBR gratings 23, 23.

The laser beam 11 oscillated in this manner is converted to a second harmonic 15 whose wavelength is one-half the wavelength of the laser beam 11 (fundamental wavelength). The rear facet 30b of the optical wavelength converter 30' has a coating, which becomes a HR coating with respect to the second harmonic 15 and becomes an AR coating with respect to the laser beam 11. The second harmonic 15 is emitted from the front facet 20b of the second wavelength selector 20.

In the laser light source of the fifth embodiment, the rear facet 10a of the semiconductor laser chip 10" and the front facet 20a of the first wavelength selector 20 are provided with coatings which become AR coatings with respect to the emission wavelength of the laser light source. In addition, the front facet 10b of the semiconductor laser chip 10" and the rear facet 30b of the optical wavelength converter 30' are provided with coatings which become AR coatings with respect to the emission wavelength. Furthermore, the bent portions of the stripe 12" are formed oblique to both end faces 10a, 10b of the semiconductor laser chip 10". Therefore, the laser light source of the fifth embodiment has practically no Fabry-Perot mode between both end facets 10a and 10b of the semiconductor laser chip 10".

In the fifth embodiment, the FWHM of the width of the wavelength selected by each of the DBR gratings 23 of the two wavelength selectors 20 is 0.12 nm (see FIG. 4A). If such wavelength selectors 20 are disposed on both sides of the semiconductor laser chip 10", the total wavelength characteristic is equal to the square of the wavelength characteristic of FIG. 4A and therefore the width of the selected wavelength becomes 0.1 nm (see FIG. 4B). In addition, the spectral distribution of the laser emission can be further narrowed by slightly (about a few tenths of 1 nm) shifting the selection center wavelengths of the two wavelength selectors from each other. Thus, in the case of employing two wavelength selectors, there is an advantage that the degree of freedom of the laser light source design can be increased.

Note that in the first embodiment of FIG. 1, the semiconductor laser chip 10" with the bent stripe 12" can be employed instead of the semiconductor laser chip 10. In that case, it is necessary the inclination of the channel type optical waveguide 122 of the second wavelength selector 120 be reversed. That is, the optical waveguide 122 needs to be sloped upward toward the front facet thereof. The same applies to the second embodiment of FIG. 6 and the third embodiment of FIG. 7.

Figure 13:
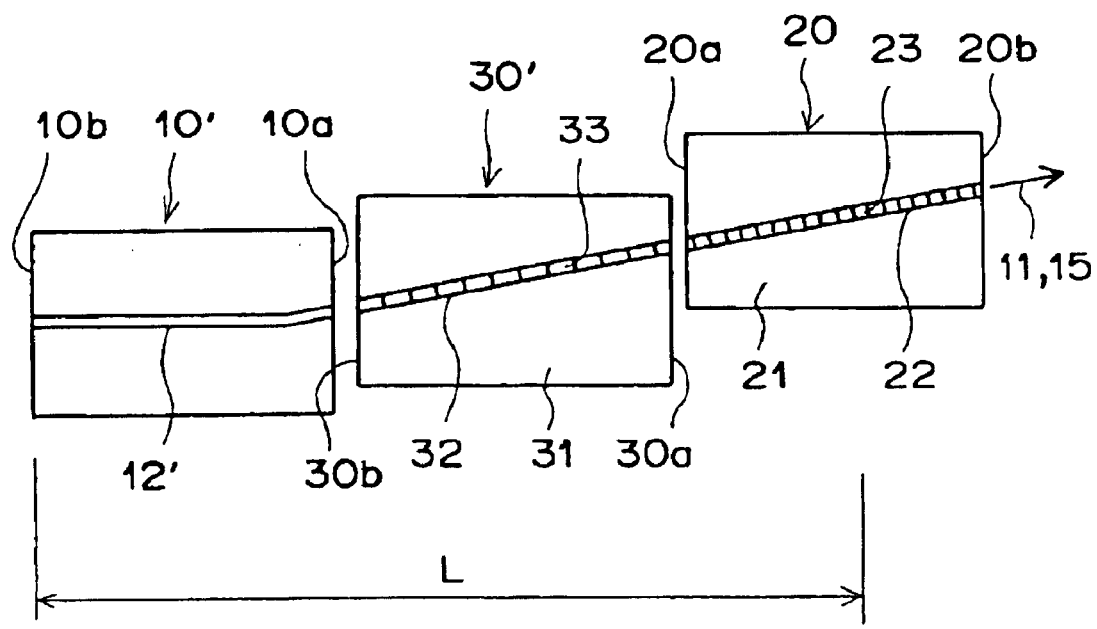
FIG. 13 is a diagrammatic plan view showing a laser light source constructed according to a sixth embodiment of the present invention.

FIG. 13 shows a laser light source constructed according to a sixth embodiment of the present invention. As shown in the figure, the laser light source of the sixth embodiment differs from the laser light source of FIG. 12 in that the semiconductor laser chip 10" and the left wavelength selector 20 are replaced with a single semiconductor laser chip 10'. The semiconductor laser chip 10' is the same as that employed in the laser light source of FIG. 11.

The front facet 10a and rear facet 10b of the semiconductor laser chip 10' are provided with coatings which become an AR coating and a HR coating with respect to the emission wavelength, respectively. In addition, both end faces 30a, 30b of an optical wavelength converter 30' and both end facets 20a, 20b of a wavelength selector 20 are provided with coatings which become AR coatings with respect to the emission wavelength. With this arrangement, the external resonator of the sixth embodiment is formed by the rear facet 10b of the semiconductor laser chip 10' and the DBR grating 23 of the wavelength selector 20.

In the sixth embodiment, the longitudinal lengths of the semiconductor laser chip 10', the optical wavelength converter 30', and the wavelength selector 20 are 0.75 mm, 10 mm, and 5 mm, respectively. In addition, the longitudinal mode width of the external resonator is about 0.02 nm, and the FWHM of the width of the wavelength selected by the DBR grating 23 is 0.12 mm. In the sixth embodiment, the emission wavelength of a laser beam 11 that is a fundamental wave is stable within the allowable phase-matching wavelength width of the wavelength conversion of the laser beam 11. Therefore, the second harmonic 15 can be output with stability.

In addition, in the case where the laser light source of the sixth embodiment is operated with high-frequency superposition, stable multi-mode emission can be realized in a wide driving-current range, as with the laser light source of the third embodiment. In addition, discontinuous output changes due to mode hops are suppressed and therefore stable output can be obtained.

FIG. 14 shows a laser light source constructed according to a seventh embodiment of the present invention. As shown in the figure, in the laser light source of the seventh embodiment, the wavelength selector 20 and the optical wavelength converter 30' of FIG. 13 are disposed in reversed order. Therefore, the external resonator of the seventh embodiment is similarly formed by the rear facet 10b of the semiconductor laser chip 10' and the DBR grating 23 of the wavelength selector 20. Even if the laser light source of the present invention is constructed like the seventh embodiment, the same effect as that in the laser light source of FIG. 13 can be obtained.

Figure 15:
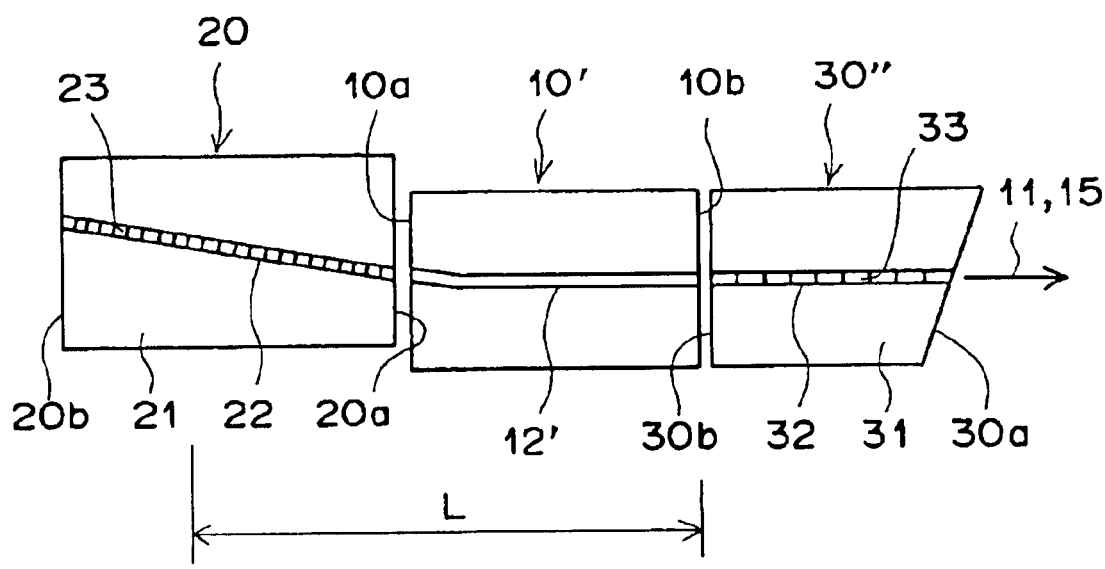
FIG. 15 is a diagrammatic plan view showing a laser light source constructed according to an eighth embodiment of the present invention.
Figure 17:
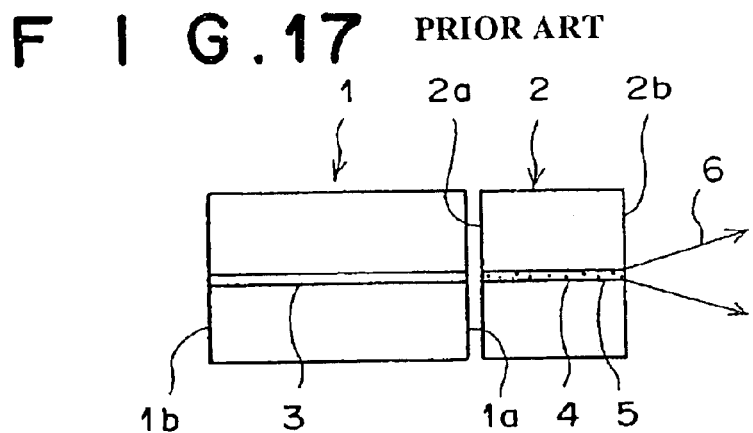
FIG. 17 is a diagrammatic plan view showing a conventional laser light source.
Figure 18:
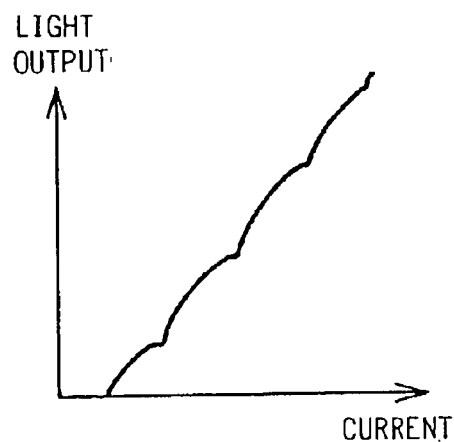
FIG. 18 is a graph schematically showing the driving current versus light output characteristic of the laser light source shown in FIG. 17.

FIG. 15 shows a laser light source constructed according to an eighth embodiment of the present invention. In the laser light source of the eighth embodiment, as shown in the figure, an optical wavelength converter 30" is added so that it is coupled directly to the semiconductor laser chip 10' of the seventh embodiment of FIG. 11.

The optical wavelength selector 30" is basically the same as the optical wavelength selector 30 shown in FIG. 7, but the channel type optical waveguide 32 is formed perpendicular to the rear facet 30b. In addition, the front facet 30a of the optical wavelength converter 30" is formed oblique to the channel type optical waveguide 32.

The end facets of the semiconductor laser chip 10' and the wavelength selector 20 are provided with the same coatings as those of the laser light source of FIG. 11. On the other hand, the rear facet 30b of the optical wavelength converter 30", which is coupled directly with the semiconductor laser chip 10', is provided with a coating, which becomes an AR coating with respect to the laser beam (fundamental wave) 11 and becomes a HR coating with respect to the second harmonic 15. In addition, the front facet 30a of the optical wavelength converter 30" is provided with a coating which becomes a HR coating with respect to the laser beam 11 and becomes an LR coating with respect to the second harmonic 15.

In the laser light source of the eighth embodiment, as with the fourth embodiment of FIG. 11, the external resonator is formed by the front facet 10b of the semiconductor laser chip 10' and the grating 23 of the wavelength selector 20. The laser beam 11 oscillated is incident on the optical wavelength converter 30" and converted to a second harmonic 15. The second harmonic 15 is emitted from the front facet 30a of the optical wavelength converter 30".

In the eighth embodiment, the same advantages as the fourth embodiment of FIG. 11 are obtained for stabilization of the emission wavelength and the laser output. In addition, in the eighth embodiment, the front facet 30a of the optical wavelength converter 30" is cut oblique to the direction where the optical waveguide 32 extends. Therefore, there is no possibility that the reflected light at the front facet 30a will be incident on the optical waveguide 32 again. In such a case, since there is no possibility that the reflected light at the front facet 30a will become return light and be incident on the semiconductor laser chip 10', the problem of noise and output fluctuation due to the return light can be prevented.

FIG. 16 shows a laser light source constructed according to a ninth embodiment of the present invention. As shown in the figure, the laser light source of the ninth embodiment is constructed of the same semiconductor laser chip 10' as that employed in FIG. 11 or FIG. 15; a collimator lens 70 for collimating the laser beam 11 emitted divergently from the rear facet 10a of the semiconductor laser chip 10'; a collective lens 71 for collecting the collimated laser beam 11; a mirror 72, disposed at a position where the laser beam 11 is converged by the collective lens 71, for reflecting the laser beam 11; and a narrow-band pass filter 73 disposed between the collimator lens 70 and the collective lens 71.

The rear facet 10a and front facet 10b of the semiconductor laser chip 10' are provided with coatings which become an AR coating and an LR coating with respect to the emission wavelength, respectively. The stripe 12' of the semiconductor laser chip 10' has a bent portion which is formed oblique to the rear facet 10a, and a straight portion which is formed perpendicular to the front facet 10b.

In the aforementioned construction, the laser beam 11 reflected at the mirror 72 is returned to the semiconductor laser chip 10'. Since the wavelength of the laser beam 11 being returned to the semiconductor laser chip 10' is selected by the narrow-band pass filter 73, the emission wavelength is locked at the selected wavelength. In addition, the rear facet 10a of the semiconductor laser chip 10' is provided with a coating which becomes an AR coating with respect to the emission wavelength, and the stripe 12' of the semiconductor laser chip 10' is formed oblique to the rear facet 10a. Therefore, the occurrence of the Fabry-Perot mode is suppressed between both end facets 10a and 10b of the semiconductor laser chip 10', and the same advantages as those of the embodiments mentioned above can be obtained.

While certain representative embodiments and details have been shown for the purpose of illustrating the present invention, it will be apparent to those skilled in this art that various changes and modifications may be made without departing from the scope of the invention hereinafter claimed.

What is claimed is:

1. A laser light source comprising:
   a semiconductor light-emitting device for emitting light having two cleaved end facets;
   an external resonator including a wavelength selector which selects a wavelength of said light;
   wherein a stripe is formed in said semiconductor light-emitting device so that it is oblique to one end facet, which does not constitute said external resonator, of the two cleaved end facets of said semiconductor light-emitting device; and
   said one end facet of said semiconductor light-emitting device has a coating which becomes an antireflection coating with respect to the selected wavelength;
   wherein an optical waveguide device comprising an optical waveguide is coupled to said semiconductor light-emitting device;
   said wavelength selector has a function of returning the wavelength-selected light to said semiconductor light-emitting device and is disposed on one side of said semiconductor light-emitting device;
   said optical waveguide device is disposed on the other side of said semiconductor light-emitting device; and
   said external resonator is constituted by an end facet, on the opposite side from said semiconductor light-emitting device, of said optical waveguide device, and said wavelength selector;
   wherein said end facet of said optical waveguide device is perpendicular to said optical waveguide.

2. The laser light source as set forth in claim 1, wherein said wavelength selector comprises two wavelength selectors, disposed on both sides of said semiconductor light-emitting device one by one, and having a function of returning the wavelength-selected light to said semiconductor light-emitting device.

3. The laser light source as set forth in claim 2, wherein an optical waveguide device is coupled to said semiconductor light-emitting device or wavelength selector.

4. The laser light source as set forth in claim 1, wherein said stripe has a bent portion and is formed perpendicular to said end facet, on the opposite side from said wavelength selector, of said semiconductor light-emitting device.

5. The laser light source as set forth in claim 4, wherein an optical waveguide device is coupled to said semiconductor light-emitting device or wavelength selector.

6. The laser light source as set forth in claim 1, wherein an optical waveguide device is coupled to said semiconductor light-emitting device or wavelength selector.

7. The laser light source as set forth in claim 1, wherein said optical waveguide device has a wavelength converting function.

8. The laser light source as set forth in claim 7, wherein the width of the wavelength selected by said wavelength selector is nearly the same as an allowable phase-marching wavelength width for wavelength conversion which is performed by said optical waveguide device having a wavelength converting function.

9. The laser light source as set forth in claim 7, wherein said optical waveguide device is disposed in said external resonator.

10. The laser light source as set forth in claim 7, wherein said optical waveguide is coupled directly to said semiconductor light-emitting device.

11. The laser light source as set forth in claim 1, wherein the width of the wavelength selected by said wavelength selector is nearly the same as an allowable phase-matching wavelength width for wavelength conversion which is performed by said optical waveguide device having a wavelength converting function.

12. The laser light source as set forth in claim 11, wherein said optical waveguide device is disposed in said external resonator.

13. The laser light source as set forth in claim 11, wherein said optical waveguide is coupled directly to said semiconductor light-emitting device.

14. The laser light source as set forth in claim 1, wherein said optical waveguide device is disposed in said external resonator.

15. The laser light source as set forth in claim 14, wherein an end facet of said optical waveguide device that constitutes said external resonator is cut perpendicular to a direction where an optical waveguide of said optical waveguide device extends.

16. The laser light source as set forth in claim 15, wherein said optical waveguide is coupled directly to said semiconductor light-emitting device.

17. The laser light source as set forth in claim 14, wherein an end facet of said optical waveguide device that does not constitute said external resonator is cut oblique to a direction where an optical waveguide of said optical waveguide device extends.

18. The laser light source as set forth in claim 17, wherein said optical waveguide is coupled directly to said semiconductor light-emitting device.

19. The laser light source as set forth in claim 14, wherein said optical waveguide is coupled directly to said semiconductor light-emitting device.

20. The laser light source as set forth in claim 1, wherein said optical waveguide is coupled directly to said semiconductor light-emitting device.

21. The laser light source as set forth in claim 1, wherein said wavelength selector is a waveguide type wavelength selector having a reflection Bragg grating in an optical waveguide portion.

22. The laser light source as set forth in claim 21, wherein said wavelength selector and said semiconductor light-emitting device are coupled directly with each other.

23. The laser light source as set forth in claim 1, wherein
   a longitudinal mode width of said external resonator is less than the width of the wavelength selected by said wavelength selector; and
   said laser light source is operated in a multi-longitudinal mode which is within the width of said selected wavelength by high-frequency superposition.

24. A laser light source comprising:
   a semiconductor light-emitting device for emitting light having two cleaved end facets;
   an external resonator including a wavelength selector which selects a wavelength of said light;
   wherein a stripe is formed in said semiconductor light-emitting device so that it is oblique to one end facet, which does not constitute said external resonator, of the two cleaved end facets of said semiconductor light-emitting device;
   said one end facet of said semiconductor light-emitting device has a coating which becomes an antireflection coating with respect to the selected wavelength;
   wherein said external resonator is constituted by a mirror, disposed to face one end facet of said semiconductor light-emitting device, and the other end facet of said semiconductor light-emitting device; and
   said wavelength selector comprises a narrow-band pass filter disposed between said mirror and said semiconductor light-emitting device.

25. The laser light source as set forth in claim 24, further comprising a drive circuit that drives said semiconductor light-emitting device with high-frequency superposition.

26. The laser light source as set forth in claim 24, wherein
   a longitudinal mode width of said external resonator is less than the width of the wavelength selected by said wavelength selector; and
   said laser light source is operated in a multi-longitudinal mode which is within the width of said selected wavelength by high-frequency superposition.

27. A laser light source comprising:
   a semiconductor light-emitting device for emitting light having two cleaved end facets;
   an external resonator including a wavelength selector which selects a wavelength of said light;
   wherein a stripe is formed in said semiconductor light-emitting device so that it is oblique to one end facet, which does not constitute said external resonator, of the two cleaved end facets of said semiconductor light-emitting device;
   said one end facet of said semiconductor light-emitting device has a coating which becomes an antireflection coating with respect to the selected wavelength; and
   a drive circuit that drives said semiconductor light-emitting device with high-frequency superposition.

28. The laser light source as set forth in claim 27, wherein
   a longitudinal mode width of said external resonator is less than the width of the wavelength selected by said wavelength selector; and
   said laser light source is operated in a multi-longitudinal mode which is within the width of said selected wavelength by said high-frequency superposition.

29. The laser light source as set forth in any one of the preceding claims, further comprising temperature control means for maintaining the devices, which constitute said external resonator, at a predetermined temperature.

* * * * *